United States Patent [19]

DasGupta

[11] 4,408,336

[45] Oct. 4, 1983

[54] HIGH SPEED BINARY COUNTER

[75] Inventor: Sumit DasGupta, Wappingers Falls, N.Y.

[73] Assignee: International Business Machines Corp., Armonk, N.Y.

[21] Appl. No.: 259,878

[22] Filed: May 4, 1981

[51] Int. Cl.³ .......................................... H03K 23/08
[52] U.S. Cl. ....................................... 377/34; 377/116
[58] Field of Search ...................... 377/34, 33, 108, 54, 377/116; 340/347 DD

[56] References Cited

U.S. PATENT DOCUMENTS

| | | | |
|---|---|---|---|
| 2,922,151 | 1/1960 | Reiling | 340/347 DD |
| 3,349,332 | 10/1967 | Bleickardt | 377/34 |
| 3,373,421 | 3/1968 | Wang | 340/347 DD |
| 3,515,341 | 6/1970 | Frick | 377/34 |
| 3,588,461 | 6/1971 | Halsall | 377/34 |
| 4,264,807 | 4/1981 | Moen et al. | 377/34 |

*Primary Examiner*—Gary Chin
*Attorney, Agent, or Firm*—James E. Murray

[57] ABSTRACT

A plurality of two stage Gray code counters are connected in series to generate a multiple bit pseudo Gray code count $C_0, C_1, \ldots, C_7$. A binary count $B_0, B_1, \ldots, B_7$ is then generated by using the odd subscripted bits $C_1, C_3, C_5, C_7$ of the pseudo Gray code as the binary count bits $B_1, B_3, B_5, B_7$ and generating the even subscripted bits of the binary count $B_0, B_2, B_4, B_6$ by Exclusive ORing the odd and even position counts of each two stage Gray code counter together in Exclusive OR circuits.

4 Claims, 3 Drawing Figures

FIG. 2
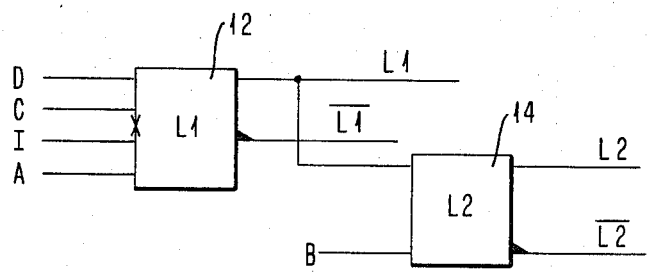
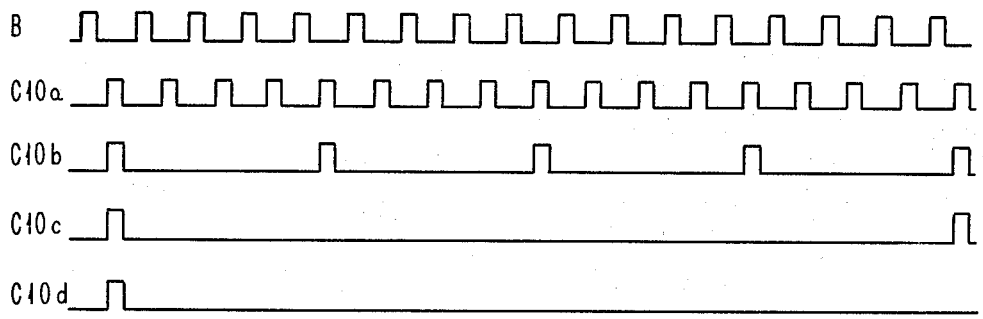
FIG. 3
| COUNTER OUTPUT | | | | DESIRED BINARY COUNT | | | |
|---|---|---|---|---|---|---|---|
| $C_3$ | $C_2$ | $C_1$ | $C_0$ | $B_3$ | $B_2$ | $B_1$ | $B_0$ |
| 0 | 0 | 0 | 0 | 0 | 0 | 0 | 0 |
| 0 | 0 | 0 | 1 | 0 | 0 | 0 | 1 |
| 0 | 0 | 1 | 1 | 0 | 0 | 1 | 0 |
| 0 | 0 | 1 | 0 | 0 | 0 | 1 | 1 |
| 0 | 1 | 0 | 0 | 0 | 1 | 0 | 0 |
| 0 | 1 | 0 | 1 | 0 | 1 | 0 | 1 |
| 0 | 1 | 1 | 1 | 0 | 1 | 1 | 0 |
| 0 | 1 | 1 | 0 | 0 | 1 | 1 | 1 |
| 1 | 1 | 0 | 0 | 1 | 0 | 0 | 0 |
| 1 | 1 | 0 | 1 | 1 | 0 | 0 | 1 |
| 1 | 1 | 1 | 1 | 1 | 0 | 1 | 0 |
| 1 | 1 | 1 | 0 | 1 | 0 | 1 | 1 |
| 1 | 0 | 0 | 0 | 1 | 1 | 0 | 0 |
| 1 | 0 | 0 | 1 | 1 | 1 | 0 | 1 |
| 1 | 0 | 1 | 1 | 1 | 1 | 1 | 0 |
| 1 | 0 | 1 | 0 | 1 | 1 | 1 | 1 |

HIGH SPEED BINARY COUNTER

INTRODUCTION

The present invention relates to binary counters and more particularly to the reduction in the number logic circuits used in binary counters.

A binary counter can be considered as a string of trigger stages driven one after the other by an input signal whose frequency is divided by two as it is used to drive each sequentially higher order trigger stage in the string. The division of the frequency of the input signal for any given stage can be accomplished by ANDing the clock input signal to the counter with the outputs of all the lower order stages. This arrangement requires frequency divider driver for each shift register stage. The number of AND computations that must be performed by a frequency divider driver increases geometrically with the number of shift register stages in the string. Therefore it is very desirable to find a means by which the number of such drivers can be reduced.

THE INVENTION

In accordance with the present invention, the number of drivers is reduced. This is accomplished by connecting a plurality of two stage Gray code counters in series to generate a multiple bit pseudo Gray code count $C_0$, $C_1$, ..., $C_7$. A binary count $B_0$, $B_1$, ..., $B_7$ is then generated from this pseudo Gray code count by using the odd-subscripted bits $C_1$, $C_3$, $C_5$, $C_7$ of the pseudo Gray code count as the binary count bits $B_1$, $B_3$, $B_5$, $B_7$, and generating the even subscripted bits of the binary count $B_0$, $B_2$, ..., $B_6$ by Exclusive ORing the odd and even positions counts of each two stage Gray code counter together in Exclusive OR circuits. The stages of each two stage Gray code counter share a single driver reducing by half the number of drivers needed for a counter of a given length.

Therefore it is an object of the present invention to provide a new binary counter.

It is a further object of the invention to provide a binary counter that requires less drive circuits than prior art binary counters.

It is a further object of the invention to provide a binary counter of reduced complexity.

THE DRAWINGS

These and other objects of the invention can be better understood by referring to the accompanying figures of which:

FIG. 2 is a block diagram of one stage of the two stage Gray code counter.

FIG. 3 is a table showing the counting sequence in a four stage pseudo Gray code counter and the desired binary counting sequence.

DETAILED DESCRIPTION

Figure 1:
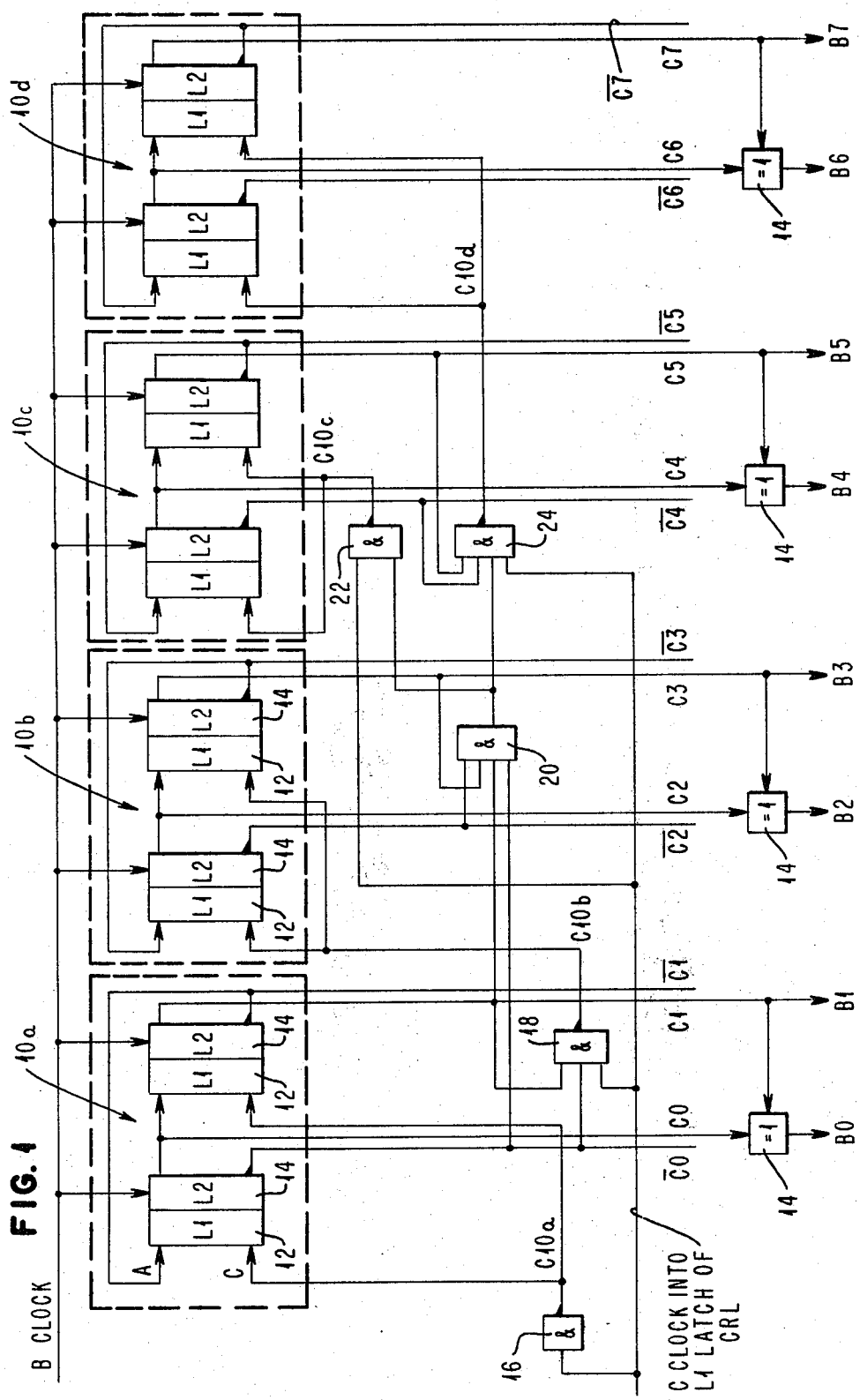
FIG. 1 is a diagram showing a counter incorporating the present invention.

Referring now to FIG. 1, four two stage Gray code counters 10 are shown connected together so as to produce a 2N digit pseudo Gray code count $C_0$, $C_1$, $C_2$, ..., $C_7$. Each stage of each Gray code counter 10 both contain two latches 12 and 14. As shown in FIG. 2, the first latch 12 in all stages receives the clock input signal on input terminal C. It is a timing pulse. The second stage 14 of each latch receives the output of the first stage plus a second timing pulse B. The timing pulses C and B occur at mutually exclusive times with the pulse C occurring first so that a data bit entered into register 12 during C time will be entered into latch 14 in B time. Latches of the type described here are known as shift register latches (SRLs) and are well known in the prior art. A detailed description of a SRL suitable for use in the present invention can be found in U.S. Pat. No. 3,783,254, E. B. Eichelberger, "Level Sensitive Logic System", January 1, 1974.

The timing pulse B is fed to all the two bit Gray code counters at the same frequency while the frequency of the timing pulse C varies depending on which Gray code counter it is fed to. The clock $C_{10a}$ is fed to the two lowest order stages of the shift register thru AND gate 16 at the frequency of the timing pulse C which is the same as the timing pulse B. The third and fourth order stages receive a clock pulse $C_{10b}$ at one-fourth that frequency through AND gate 18 because of the ANDing the time pulse $C_{10a}$ with the outputs of the two lower order stages. The clock pulse $C_{10c}$ fed to the stages of the third Gray code counter is one-fourth the frequency of the clock pulse $C_{10b}$ fed to the two stages of the second Gray code counter as a result of ANDing with the outputs of all the lower order stages in AND circuit 22 while the clock $C_{10d}$ to the fourth Gray code counter is one-fourth the frequency of clock $C_{12c}$ as a result of ANDing in AND circuit 24.

In each Gray code counter 10, the complemented output of its last stage is fed into the data input D of its first stage along with the clock pulse $C_{10}$ while the true output of the first stage is fed to the data input D of the second stage along with the clock pulse $C_{10}$. Application of clock pulses $C_{10}$ to the first Gray code counter $10_1$ produces a true Gray code sequence of pulses at $10_a$ and at the outputs $C_0$ and $C_1$ as is shown within box 24 of FIG. 3. This is true of each of the Gray code counter stages 10, taken separately. However, when a plurality of two stage Gray code counter stages are joined together, the count of the resultant N stage counter violates the Gray code sequence. For example, when the count sequence overflows from 0010 to 0100 it violates the Gray code counting sequence. Therefore, the count of the counter is referred to as a pseudo Gray code count. A comparison of this pseudo Gray code count with the binary counting sequence shown in the right-hand table of FIG. 3 will show that the odd subscripted bits in both counts are identical while each even subscripted bit in the binary count is the Exclusive OR of that even subscripted bit in the Gray code count with the next higher odd subscripted bit in the Gray code count. Or more succinctly:

$$B_i = C_i \text{ for odd } i\text{'s}$$
$$= C_i \oplus C_{i+1} \text{ for even } i\text{'s.}$$

where
  $B_i$=any binary bit position
  $C_i$=any pseudo Gray code bit position.
The relationship expressed holds for an N digit count.

Therefore, the binary count bits $B_0$ to $B_7$ can be generated from the pseudo Gray code count bits $C_0$ to $C_7$ by using the odd subscripted bit count $C_1$, $C_3$, ..., $C_7$ of the Gray code counter as the odd subscripted bits in the binary count and by using the result of the Exclusive ORing of any even subscripted bit count of the Gray code counter with the next higher odd scripted bit of that counter as the even subscripted bits in the binary count.

Having thus described my invention, what I claim as new, and desire to secure by Letters Patent is:

1. A binary counter comprising,

N two stage Gray code counters each capable of generating a two bit gray code count, circuit means coupling said N two stage Gray code counters together for generating a 2N digit pseudo gray code count, $C_0, C_1, \ldots, C_{2N-1}$, N Exclusive OR means each for Exclusive ORing each odd and even bit output position of every N two stage Gray code counter together and, binary output means for generating a 2 N digit binary count $B_0, B_1, \ldots B_{2N-1}$ including means for using the output of the second stage of the two stage Gray code counters as the bits $B_1, B_3, B_5, \ldots, B_{2N-1}$ in the binary count and the output of the Exclusive OR circuits as the bits $B_0, B_2, B_4, \ldots, B_{2N-2}$ in the binary count whereby the pseudo Gray code count is converted to a binary count.

2. The binary counter of claim 1 wherein both stages in each of said N two stage counters receives a clock pulse from an AND gate means which ANDs the outputs of all lower order stages of said binary counter with a first timing pulse.

3. The binary counter of claim 2 wherein the count of the first stage of each two stage Gray code counter is the input to the second stage of the same two stage Gray code counter and the complement output of the second stage of each two stage Gray code counter is the input to the first stage of the same two stage Gray code counter.

4. The binary counter of claim 3 wherein each stage of every two stage Gray code counter includes two latches with the output of the first latch functioning as the input to the second latch.

* * * * *